United States Patent [19]

Huang et al.

[11] Patent Number: 5,008,730
[45] Date of Patent: Apr. 16, 1991

[54] CONTACT STUD STRUCTURE FOR SEMICONDUCTOR DEVICES

[75] Inventors: Hung-Chang W. Huang, San Jose, Calif.; Paul A. Totta, Poughkeepsie, N.Y.

[73] Assignee: International Business Machines Corporation, Armonk, N.Y.

[21] Appl. No.: 455,790

[22] Filed: Dec. 18, 1989

Related U.S. Application Data

[63] Continuation of Ser. No. 252,836, Oct. 3, 1988, abandoned.

[51] Int. Cl.$^5$ .................... H01L 23/48; H01L 29/46; H01L 29/64; H01L 29/34
[52] U.S. Cl. ........................ 357/68; 357/71; 357/67; 357/54
[58] Field of Search .............. 357/71, 68, 54, 67

[56] References Cited

U.S. PATENT DOCUMENTS

| | | | |
|---|---|---|---|
| 3,911,562 | 10/1975 | Youmans | 25/590 |
| 4,244,775 | 1/1981 | D'Asaro | 156/636 |
| 4,305,974 | 12/1981 | Abe et al. | 427/89 |
| 4,367,119 | 1/1983 | Logan et al. | 156/643 |
| 4,486,946 | 12/1984 | Jopke, Jr. et al. | 29/590 |
| 4,520,041 | 5/1985 | Aoyama et al. | 427/88 |
| 4,532,702 | 8/1985 | Gigante et al. | 29/578 |
| 4,536,249 | 8/1985 | Rhodes | 156/643 |
| 4,582,563 | 4/1986 | Hazuki et al. | 156/643 |
| 4,600,624 | 7/1986 | Joseph et al. | 357/71 |
| 4,689,113 | 8/1987 | Balasubramanyam | 357/71 |
| 4,720,908 | 1/1988 | Wills | 357/71 |
| 4,751,197 | 6/1988 | Wills | 437/174 |
| 4,789,648 | 12/1988 | Chow et al. | 437/225 |
| 4,795,722 | 1/1989 | Welch et al. | 437/192 |
| 4,800,176 | 1/1989 | Kakumu et al. | 437/193 |
| 4,822,753 | 4/1989 | Pintchovski et al. | 437/192 |
| 4,884,123 | 11/1989 | Dixit et al. | 357/71 |

FOREIGN PATENT DOCUMENTS

0224013 6/1987 European Pat. Off. .
0279588 8/1988 European Pat. Off. .

OTHER PUBLICATIONS

Y. Pauleau, "Interconnect Materials for VLSI Circuits," Solid State Technology, vol. 30, No. 4, pp. 155–162, (Apr. 1987).

IEEE Cat. No. 86 CH23374, Jun. 9–10, 1986, "A Contact Filling Process with CVD-Tungsten for Multilevel Metallization Systems", pp. 443–449 by Higelin et al.

*Primary Examiner*—Mark Prenty
*Attorney, Agent, or Firm*—Alexander Tognino; Aziz M. Ahsan

[57] ABSTRACT

A method for forming contact studs to connect the substrate component devices to the overlying wiring patterns is disclosed herein. The contact studs are formed by a combination of blanket depositing an adhesive and reactive layer into the contact opening. Onto said adhesive and reactive layer is deposited a seed layer and said contact stud is completed by filling the contact opening with a third metal layer. Preferably, the adhesive and reactive layer is a transition metal and the seen and fillter layers are refractory metals.

20 Claims, 2 Drawing Sheets

CONTACT STUD STRUCTURE FOR SEMICONDUCTOR DEVICES

This application is a continuation of U.S. patent application Ser. No. 252,836, filed on Oct. 3, 1988, now abandoned.

BACKGROUND OF THE INVENTION

1. Field of the Invention

In general, this invention relates to a method for producing multi-level, co-planar, metal/insulator interconnection layers for high performance semiconductor chips and more particularly to a method for making contact studs for interconnecting the metallization layers at different levels in said semiconductor chips.

2. Description of Related Art

A semiconductor chip consists of an array of devices whose contacts are interconnected by patterns of metal wires. In VLSI chips these metal patterns are multi-layered and separated by layers of an insulating material. Interconnections between the layers of metal wiring patterns are made by holes (or via-holes), which are etched through the insulator. Typical chip designs consist of one, two or three wiring levels.

The forming of an interconnection metallurgy system for integrated circuit devices has conventionally been done by blanket depositing a metal layer, forming a photoresist layer on the metal layer, exposing the resist to the desired metallurgy pattern, developing the resist, and subsequently etching the exposed portions of the underlying metal layer to thereby form the interconnection wiring. The wiring pattern was subsequently covered by an insulating layer, planarized and then another metallurgy pattern was then formed on said insulating layer. Contact between layers was made through via holes, until the desired interconnection wiring diagram was complete.

Interconnection of the multi-level wiring structure to the device contacts on the substrate was typically made by the incorporation of an access wiring layer.

In an effort to further reduce device processing time and reduce size, access wiring layers were replaced by via studs or vertical wires, known in the art as studs. Studs were now able to be placed directly on top of the device contacts to make interconnection with the above multi-level wiring system.

Studs are known to be formed by using what is termed an "expendable mask method" or "lift-off method", which was initially described and claimed in U.S. Pat. No. 2,559,389. Improvements to the basic lift-off method have been made, as for example in commonly assigned U.S. Pat. Nos. 3,849,136 filed Aug. 31, 1973 and 3,873,361 filed Nov. 29, 1973. However, the lift-off technique for forming stud metallurgy does not totally overcome the problems of: uniform deposition of stud metallurgy, planarity problems associated with achieving uniform stud height, high aspect ratio stud depositions, and electromigration tendencies of the preferred stud metallurgies.

An example of the problems associated with stud formation can be seen from the use of lift-off with aluminum as the stud metal. The aluminum must be deposited by evaporation; however, evaporation of aluminum is known to create problems of voids and irregularities in its formation.

Another problem associated with stud formation is the structural irregularities which are known to be created by the nature of the master-slice processing. For example, as master-slice processing causes variation in depth of contacts, the height of the deposited studs becomes variable such that the aluminum studs must be ion etched back to form a planar surface. (See, for example, U.S. Pat. No. 4,541,169.).

While there have been many techniques proposed for achieving planarity of studs, these techniques have all been based on the use of Ion Etch back with lift-off, (For example, U.S. Pat. Nos. 4,410,622; 4,470,874, and 4,541,169) wherein the results have not achieved consistent planarity and the methods have been limited to larger line widths and studs.

Moreover, with aluminum as a stud metal, there are added problems in terms of contact alloying/penetration, electromigration, and silicon particle formation. Silicon will form particles and thin films in the contact holes which results in the aluminum being isolated from the substrate surface. Moreover, with the ever-continuing reduction of dimensions in the device multi-level interconnection system, limits as to insulation and electromigration tolerances in using aluminum are encountered.

Electromigration problems associated with aluminum deposited on silicon type substrates have been proposed to be cured by use of tungsten films as diffusion barriers (M. L. Green and R. A. Levy, Technical Proceedings, SEMICON/EAST 85, Semiconductor Equipment and Materials Institute Meeting, September, 1985, pp. 57–63). However, defects "wormholes" originating at the tungsten/silicon interface and problems with preferential erosion of N+ implanted silicon versus P+ implanted silicon from LPCVD tungsten deposition have taught against the solitary use of LPCVD tungsten as the contact stud filler metallurgy.

In a more recent publication (U. Fritsch, G. Higelin, G. Enders and W. Muller; Technical Proceedings, V-MIC Conference Meeting; June 13, 14, 1988, pp. 69–75), the authors propose one possible solution to the defects associated with deposition of CVD tungsten in CMOS devices. Therein, the authors propose first depositing a titanium/titanium nitride diffusion barrier by sputtering followed by a CVD tungsten layer. However, this structure does not create a seed layer which matches the atomic structure of the CVD refractory metal which is to follow. Therefore, there can be interface problems between the CVD refractory fill metal and the titanium nitride layer such as mechanical separation and/or electrical resistance.

It is therefore an object of the present invention to produce a method for producing a multi-level co-planar metal and insulation interconnection system for VLSI semiconductor devices.

It is a further object of the present invention to produce planar studs for contacting the substrate to the first level of interconnection wiring.

It is a still further object of the present invention to produce interconnect studs, incapable of being produced with liftoff tolerances (i.e., stud widths of less than 1.5 μm).

It is another object of the present invention to produce substrate contact studs of a non-reactive metal for void free deposition with low electromigration characteristics.

It is still another object of the present invention to provide a substrate contact stud structure useable with different component contacts.

SUMMARY OF THE INVENTION

Onto a substrate which has been processed to the point of being ready for the contact stud metallurgy, an insulator is blanket deposited. This insulator is, then, planarized and portions are then selectively removed at predetermined locations to expose the substrate surface for contact.

A reactive adhesion layer is, then, blanket deposited over said insulator and into said contact openings.

A seed layer is, then, deposited over said adhesion layer. Both the adhesion and seed layers are sputter deposited. Preferably, the adhesion layer is a transition metal capable of reducing $SiO_2$ and the seed layer is a refractory metal. However, depending on the specific transistor component to which contact is to be made, the adhesion layer can either be a transition metal or an alloy of the reactive metal with a refractory metal.

A refractory metal, such as, tungsten, is then chemically vapor deposited (CVD) as a filler layer to complete the formation of the contact studs. The surface is again planarized such that said insulator and said studs form a co-planar surface.

Successive upper layers of interconnecting metallization can now be fabricated onto said contact studs. Thus, onto said studs is deposited wiring metallurgy such that contact to said substrate is made through the previously deposited stud.

DETAILED DESCRIPTION OF THE INVENTION

Figure 1:
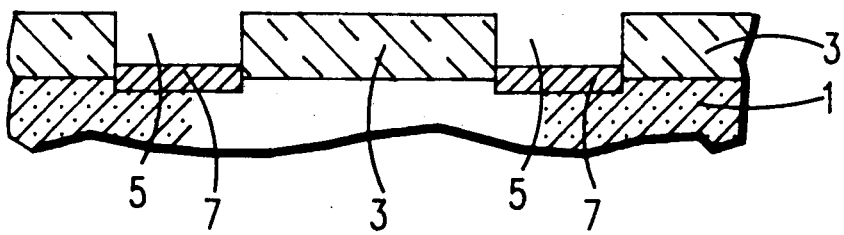
FIG. 1 is a cross-sectional representation of a portion of a semiconductor chip processed through forming a device contact on said chip.

Referring now to FIG. 1, there is shown a substrate 1, which is typically monocrystalline silicon or other semiconductor material with an overlying layer 3 of a dual dielectric layer, as for example $SiO_2/Si_3N_4$. Preferably, the dielectric layer is comprised of a layer of thermally grown $SiO_2$ about 1000Å thick onto which is thermally grown a $Si_3N_4$ layer of about 1500Å.

The substrate 1 in the preferred embodiment of the process of the invention is an integrated circuit device having active and passive devices fabricated therein and means (not shown) for electrically isolating the devices from each other. In this application, layer 3 is provided with contact openings 5 for making contact to contact area 7 (e.g., PtSi).

Figure 2:
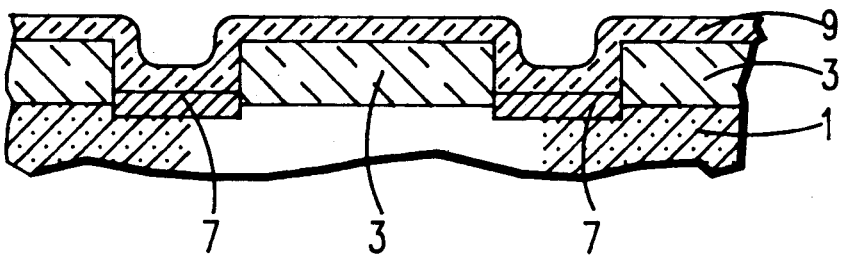
FIG. 2 shows the semiconductor structure of FIG. 1 with the deposition of an etch stop layer onto the substrate surface.

Referring now to FIG. 2, an etch stop layer 9 has been conformably deposited over the dielectric layer 3 and the substrate 1. The etch stop layer 9 can be of any suitable inorganic material that will conformably blanket and adhere to the surface of the substrate and dielectric layer, while also presenting a significant difference to etch resistance than the subsequent overlying material.

Figure 3:
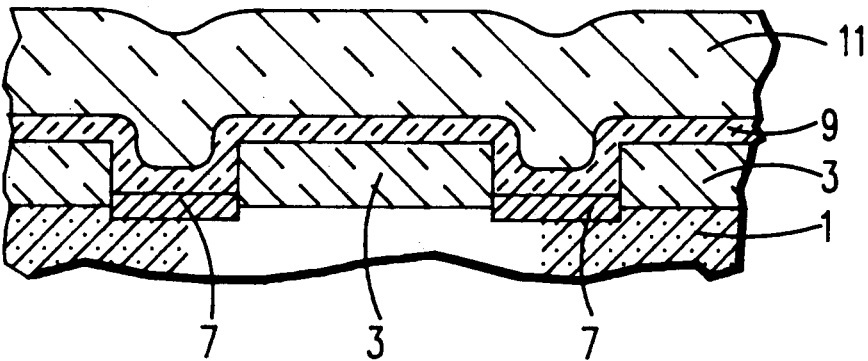
FIG. 3 shows the semiconductor structure of FIG. 2 wherein an insulator has been deposited over the semiconductor chip.
Figure 4:
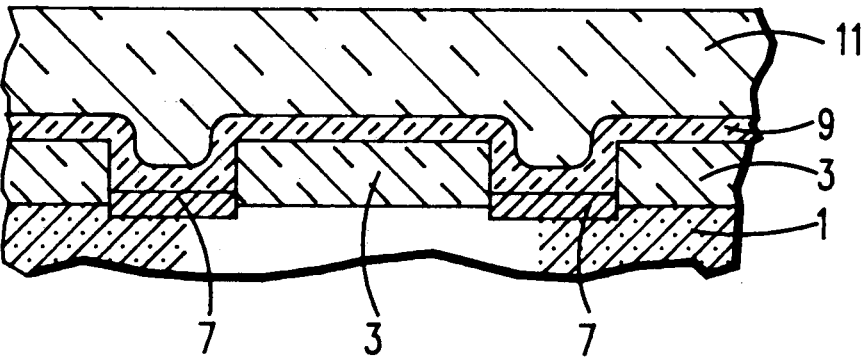
FIG. 4 shows the semiconductor structure of FIG. 3 wherein the insulator has been planarized.

As shown in FIG. 3, onto said etch stop layer 9 is deposited a second layer of insulation 11. For example, sputtered or chemically vapor deposited (CVD) $SiO_2$ or borophosphosilicate glass (BPSG) or phosphosilicate glass (PSG) can be placed down over the structure shown in FIG. 3. It should be recognized by those skilled in the art that the thickness of this layer 11 determines the thickness of the level of metallization to be formed in the channels which are to be etched into layer 11 for the formation of the stud metallurgy. Next, the layer 11 is planarized by any conventional planarizing technique including Reactive Ion Etching (RIE) etchback as shown in FIG. 4.

Figure 5:
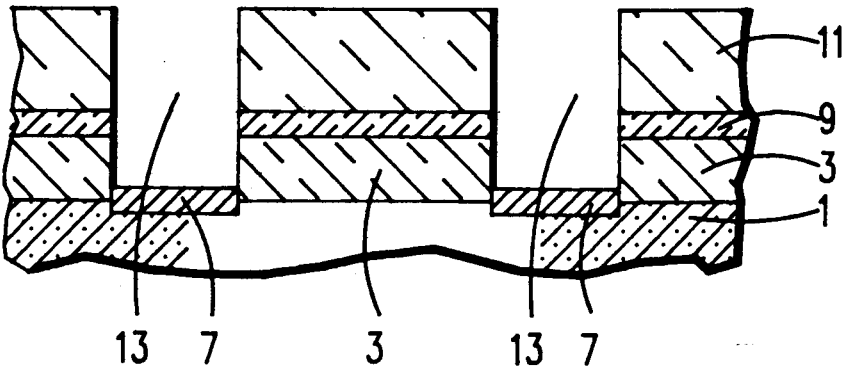
FIG. 5 shows the semiconductor structure of FIG. 4 wherein the device contacts have been exposed.

Referring now to FIG. 5, once the insulator surface has been planarized, via-holes or studs holes 13 are formed in layer 11 by using standard photolithographic and RIE techniques. The intended stud pattern is then transferred to the etch stop layer 9 by wet or RIE etch techniques, although the latter are preferred especially where fine dimensions are required. Other possible techniques of forming the via-holes or interconnection metallurgy pattern include projected laser assisted etching, sputtering techniques or reactive ion beam etching. Both layers 9 and 3 are opened to expose the substrate contact 7. It should be noted that while FIG. 5 shows the contact area 7 of the same width as the via holes or stud holes 13, the stud holes or via holes 13, can be larger than the area 7 and/or can even connect two or more contact areas 7.

Figure 6:
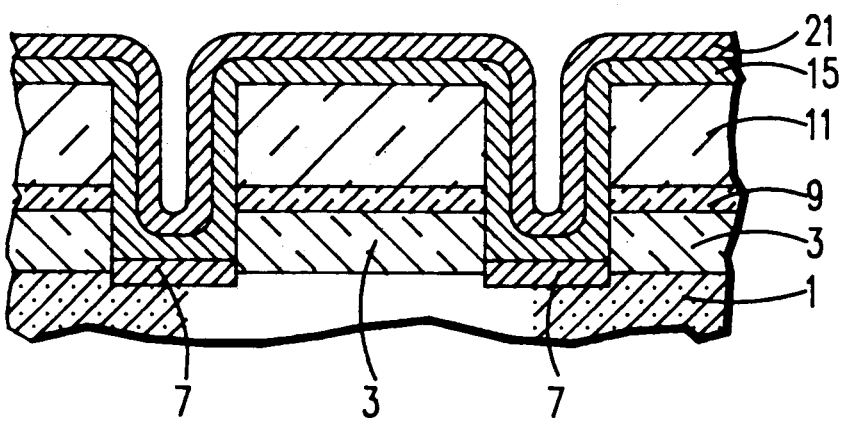
FIG. 6 shows the semiconductor structure of FIG. wherein a metal has been deposited over the surface.

After the via holes or stud holes 13 are defined, an adhesion and reactive layer 15 is sputtered or evaporated over the structure of FIG. 5 as shown in FIG. 6. The adhesion metal is deposited to be around 200Å to 1000Å thick. In the preferred embodiment, titanium is used as the adhesion metal for emitter contacts which contacts are made directly to the silicon. Those skilled in the art will recognize that $SiO_2$ and/or to form an ohmic or Schottky barrier contact without forming silicides. Other metals are also well suited for use as the adhesion and reactive metal including any of the transition metals. However, it is noted that the exact adhesion metal layer to be used will vary with the specific component contact to be structured.

For example, if the component of the integrated circuit is a low barrier height Schottky barrier diode (LSBD), it is necessary to use either a pure reactive metal (e.g., titanium) or an alloy of a reactive metal, a refractory metal (e.g. TiW alloy with 10% Ti and 90% W). This layer is, then, followed by a seed layer of pure refractory metal (e.g., sputtered tungsten).

For other contacts such as those for high barrier height Schottky barrier diodes (HSBD), base, collector and resistors; the contact areas 7 may have platinum deposited therein, which forms platinum silicide. In these contacts, only the sputtered refractory seed layer is required.

Referring again to FIG. 6, onto said adhesion and reactive layer 15 is sputtered or evaporated, a metal seed layer 21. This seed layer 21 is typically about 1000Å thick, but this is an approximation and the actual thickness can vary depending on the ability of the seed layer to prevent penetration of silicon to the subsequent filler layer.

In addition to providing a diffusion barrier to the silicon, the seed layer also acts as the nucleation layer for deposition of the filler layer 17. In the preferred embodiment, the seed layer is a metal of the class of refractory metals (i.e., tungsten, molybedenum, tantalum, etc.).

Figure 7:
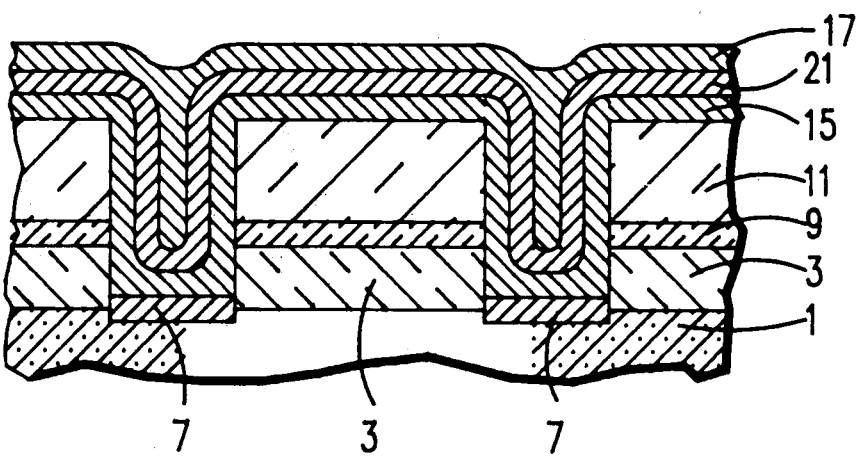
FIG. 7 shows the semiconductor structure of FIG. 6 wherein the contact stud metallurgy has been deposited over the diffusion barrier.

Onto said seed layer 21 is, then, chemically vapor deposited the contact stud filler metallurgy 17. The contact stud metallurgy is deposited so as to overlie the surface as shown in FIG. 7. The thickness of the contact stud metallurgy is at least as great as the stud via. Similar to the metallurgy of the seed layer, the refractory metals (e.g., tungsten, molybedenum, etc.) are the preferred metals for the contact studs.

Figure 8:
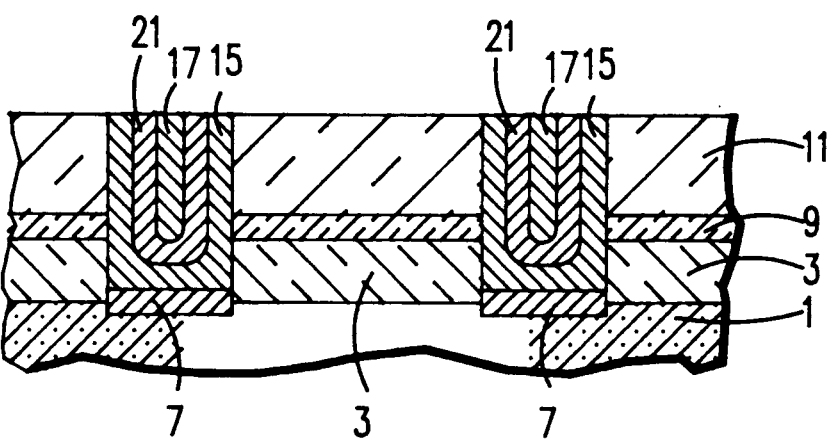
FIG. 8 shows the semiconductor structure of FIG. 7 wherein the metal and insulator has been made to be co-planar.

As seen in FIG. 8, once the filler 17 metal has been deposited, the contact stud structure can then be planarized. A number of techniques exist for planarizing dis-similar layered structures with large removal rate ratios for combination of metals and dielectric materials. Possible techniques include but are not limited to RIE Etch, etc. By these techniques, the overlying adhesion, seed and filler layers are removed such that the surface of the insulator contact and metallurgy are co-planar.

Next, interconnection channels are defined by standard photolithography in a resist overlayer (not shown). In places where a stud via connection to overlying metallization is desired, the respective channel opening in the overlayer must be aligned with and at least, partially cover a contact stud.

Figure 9:
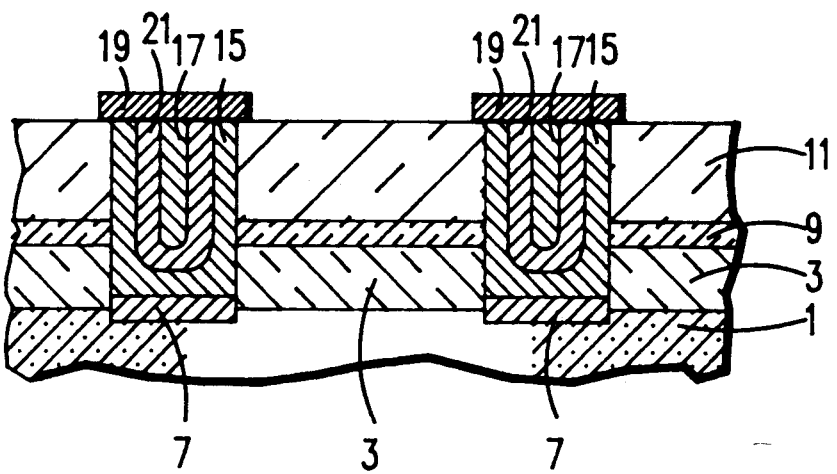
FIG. 9 shows the semiconductor structure of FIG. 8 showing the deposition of the wiring metallurgy.

As shown in FIG. 9, in one specific type of embodiment after the channels are defined in the photoresist, the overlying level of metallization 19 is deposited over the structure. The photoresist and excess metal is removed leaving interconnection metallurgy 19. However, it should be recognized by those skilled in the art that while an additive lift-off process has been described, it is also possible to practice this step of the process with a subtractive process (i.e., RIE or wet etch).

Onto said interconnection metallurgy is then deposited a layer of insulating material, for example, sputtered $SiO_2$ or CVD oxide. With the $SiO_2$ insulation, via-openings can be etched therein to contact the interconnection metallurgy. Then, stud metallurgy is sputter deposited into said via openings and overlying said insulation. Preferably, at this level, the stud metallurgy base is the same metallurgy as the interconnection metallurgy. This is, preferably, an Al—Cu based alloy.

The overlying metallurgy is then planarized to the insulator surface in preparation for the next levels of personalization. The preceding wiring process steps can then be repeated to form successive layers on the substrate.

FIG. 9, further shows that the insulator layer 3, having an etch-stop layer 9, is deposited on the device substrate 1. The insulator layer 3, has at least one opening 13, at the component contact location for the formation of the contact stud. Additionally, at least a portion of the etch-stop layer 9, surrounds the contact stud, as shown in FIG. 9. The etch-stop layer 9, can be of any suitable inorganic material that will conformably blanket and adhere to the surface of the substrate 1, and the dielectric layer 3, while also presenting a significant difference to etch resistance than the subsequent overlying material. As shown in FIG. 3, onto the etch-stop layer 9, a second layer of insulation 11, is also deposited. FIG. 9, also shows that the first metal layer 15, that is conformably deposited in the hole 13, makes a direct physical contact with the interconnection metallurgy 19.

While the invention has been particularly shown and described with reference to the preferred embodiments thereof, it will be understood by those skilled in the art that various changes in form and details may be made therein without departing from the spirit and scope of this invention.

What is claimed is:

1. A contact stud structure for the connection of semiconductor device components formed in a substrate to the wiring for interconnecting said device components to other device components comprising:
   (a) an insulator layer having an etch-stop layer deposited on said substrate, said insulator layer having at least one opening at the location of one of the semiconductor device components formed in said substrate,
   (b) a first metal layer deposited in said opening of said insulator layer and lining said opening in said insulator layer,
   (c) a second metal layer deposited conformably onto said first metal layer, and
   (d) a third metal layer deposited onto said second metal layer, said second and third metal layers being selected from the group of refractory metals with said third metal layer filling said opening in said insulator layer wherein said second and third metal layers are different from each other, and wherein said first metal layer makes a direct physical contact with the wiring for interconnecting said device components.

2. A contact stud structure according to claim 1 wherein said substrate is silicon.

3. A contact stud structure according to claim 1 wherein said substrate is monocrystalline silicon.

4. A contact stud structure according to claim 1 wherein said substrate is polycrystalline silicon.

5. A contact stud structure according to claim 1 wherein platinum is deposited in said opening on said substrate.

6. A contact stud structure according to claim 1 wherein said insulator layer is a multi-layered structure comprised of in sequence a bottom layer of $SiO_2$, a layer of $Si_3N_4$, said etch-stop layer and a top layer of $SiO_2$.

7. A contact stud structure according to claim 6 wherein said bottom $SiO_2$ layer is about 1000Å thick and said $Si_3N_4$ layer is about 1500Å thick.

8. A contact stud structure according to claim 6 wherein the aspect ratio of said opening is equal to or greater than 1.

9. A contact stud structure according to claim 1 wherein said first metal layer is selected from the group consisting of the transition metals.

10. A contact stud structure according to claim 9 wherein said first metal layer is titanium.

11. A contact stud structure according to claim 1 wherein said first metal layer is an alloy of one of the transition metals alloyed with one of the refractory metals.

12. A contact stud structure according to claim 1 wherein one of said second and third metal layers comprises tungsten.

13. A contact stud structure according to claim 11 wherein said alloy is titanium tungsten.

14. A contact stud structure according to claim 1 wherein the thickness of said first metal layer is in the range of about 200Å to about 1000Å.

15. A contact stud structure according to claim 1 wherein the thickness of said second metal layer is about 1000Å.

16. A contact stud structure according to claim 1 wherein said opening is larger than said one of said semiconductor device components formed in said substrate.

17. A contact stud structure according to claim 1 wherein said contact stud is large enough to contact a plurality of said semiconductor device components formed in said substrate.

18. A contact stud structure for the connection of semiconductor device components formed in a substrate to the wiring for interconnecting said device components to other device components comprising:

(a) an insulator layer having an etch-stop layer deposited on said substrate, said insulator layer and said etch-stop layer having at least one opening at the location of one of the semiconductor device components formed in said substrate, (b) a first metal layer deposited in said opening of said insulator layer and lining said opening in said insulator layer, (c) a second metal layer deposited conformably onto said first metal layer, and (d) a third metal layer deposited onto said second metal layer, said second and third metal layers being selected from the group of refractory metals with said third metal layer filling said opening in said insulator layer wherein at least a portion of said first metal layer extends through said opening in said etch-stop layer.

19. The contact stud structure according to claim 18 wherein said etch-stop layer is a suitable inorganic material.

20. The contact stud structure according to claim 18 wherein a second insulator layer is deposited over said etch-stop layer.

* * * * *